(12) United States Patent
Shaul et al.

(10) Patent No.: US 11,424,195 B2
(45) Date of Patent: Aug. 23, 2022

(54) MICROELECTRONIC ASSEMBLIES HAVING FRONT END UNDER EMBEDDED RADIO FREQUENCY DIE

(71) Applicant: Intel Corporation, Santa Clara, CA (US)

(72) Inventors: Eliav Shaul, Hosen (IL); Avi Tsarfati, Petach Tikva M (IL)

(73) Assignee: Intel Corporation, Santa Clara, CA (US)

( * ) Notice: Subject to any disclaimer, the term of this patent is extended or adjusted under 35 U.S.C. 154(b) by 884 days.

(21) Appl. No.: 15/942,824

(22) Filed: Apr. 2, 2018

(65) Prior Publication Data

US 2019/0304936 A1 Oct. 3, 2019

(51) Int. Cl.
*H05K 1/02* (2006.01)
*H05K 1/16* (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC . H01L 23/66; H01L 23/5383; H01L 23/5386; H01L 23/5389; H01L 23/552; H01L 24/20; H01L 24/19; H01L 21/4857; H01L 21/4853; H01L 21/565; H01L 25/16; H01L 23/3128; H01L 23/3114; H01L 2223/6672; H01L 2223/6677; H01L 2224/214; H01L 2924/1421; H01L 2924/19051; H01L 2924/19011; H01L 2924/19106; H01L 2924/1904; H01L 2924/19042; H01L 2924/19041; H01L 2924/3025; H01L 2223/6605; H01L 24/16; H01L 2224/16225; H01L 2924/19102; H01L 24/17; H01L 24/32; H01L 2224/32225; H01L 2224/32227; H01L 2224/17181; H01L 2224/16145; H01L 24/13; H01L 2224/83851; H01L 2224/83101; H01L 2224/73204;
(Continued)

(56) References Cited

U.S. PATENT DOCUMENTS 6,628,178 B2 * 9/2003 Uchikoba .............. H01L 24/97
257/728
7,477,197 B2 * 1/2009 Zeng .................... H05K 1/0218
333/24 C

(Continued)

*Primary Examiner* — Xiaoliang Chen
(74) *Attorney, Agent, or Firm* — Akona IP (57) ABSTRACT

Microelectronic assemblies, and related devices and methods, are disclosed herein. For example, in some embodiments, a microelectronic assembly may include a package substrate having a first surface and an opposing second surface; a radio frequency (RF) die having a lateral surface area and a plurality of contacts on a face, where the RF die is embedded in the package substrate with the plurality of contacts facing towards the second surface of the package substrate, and an RF front end between the RF die and the first surface of the package substrate, where the RF front end is positioned under the RF die and does not extend beyond the lateral surface area of the RF die.

23 Claims, 6 Drawing Sheets

(51) Int. Cl.
    *H05K 1/18*             (2006.01)
    *H01L 21/50*            (2006.01)
    *H01L 23/00*            (2006.01)
    *H01L 23/60*            (2006.01)
    *H01L 23/66*            (2006.01)
    *H01L 23/552*          (2006.01)
    *H01L 25/00*            (2006.01)
    *H01L 25/16*            (2006.01)
    *H01L 25/18*            (2006.01)
    *H01L 25/065*          (2006.01)
    *H01Q 1/22*             (2006.01)
    *H01Q 1/38*             (2006.01)
    *H01Q 1/48*             (2006.01)
    *H01Q 1/50*             (2006.01)
    *H01L 23/538*          (2006.01)
    *H01L 21/48*            (2006.01)
    *H01L 21/56*            (2006.01)
    *H01L 23/31*            (2006.01)
    *H05K 1/11*             (2006.01)

(52) U.S. Cl.
    CPC ........ *H01L 21/565* (2013.01); *H01L 23/3114* (2013.01); *H01L 23/3128* (2013.01); *H01L 23/5383* (2013.01); *H01L 23/5386* (2013.01); *H01L 23/5389* (2013.01); *H01L 23/552* (2013.01); *H01L 24/19* (2013.01); *H01L 24/20* (2013.01); *H01L 25/16* (2013.01); *H01L 24/16* (2013.01); *H01L 2223/6605* (2013.01); *H01L 2223/6672* (2013.01); *H01L 2223/6677* (2013.01); *H01L 2224/16225* (2013.01); *H01L 2224/214* (2013.01); *H01L 2924/1421* (2013.01); *H01L 2924/1904* (2013.01); *H01L 2924/19011* (2013.01); *H01L 2924/19041* (2013.01); *H01L 2924/19042* (2013.01); *H01L 2924/19051* (2013.01); *H01L 2924/19102* (2013.01); *H01L 2924/19106* (2013.01); *H01L 2924/3025* (2013.01); *H01Q 1/38* (2013.01); *H05K 1/0243* (2013.01); *H05K 1/111* (2013.01); *H05K 1/181* (2013.01); *H05K 2201/1003* (2013.01); *H05K 2201/1006* (2013.01); *H05K 2201/10015* (2013.01); *H05K 2201/10045* (2013.01); *H05K 2201/1053* (2013.01); *H05K 2201/10734* (2013.01)

(58) Field of Classification Search
    CPC . H01L 2224/81895; H01L 2224/16227; H01L 2224/81815; H01L 21/50; H01L 23/00; H01L 23/60; H01L 23/3677; H01L 24/24; H01L 24/97; H01L 24/98; H01L 25/00; H01L 25/18; H01L 25/50; H01L 25/065; H01L 25/105; H01Q 1/38; H01Q 1/2283; H01Q 3/26; H01Q 1/22; H01Q 1/48; H01Q 1/50; H05K 1/0243; H05K 1/111; H05K 1/181; H05K 2201/10734; H05K 2201/1053; H05K 2201/10015; H05K 2201/1003; H05K 2201/10045; H05K 2201/1006; H05K 1/02; H05K 1/028; H05K 1/0218; H05K 1/0219; H05K 1/16; H05K 1/18; H05K 1/141; H05K 1/185; H05K 1/189
    See application file for complete search history.

(56) References Cited

U.S. PATENT DOCUMENTS

| | | | | |
|---|---|---|---|---|
| 7,848,727 | B2* | 12/2010 | Block | H01L 23/66 455/313 |
| 7,859,359 | B2* | 12/2010 | Rofougaran | H01L 23/66 333/101 |
| 8,218,323 | B2* | 7/2012 | Choudhury | H01L 24/25 361/719 |
| 9,991,219 | B2* | 6/2018 | Seol | H01L 24/25 |
| 2014/0062607 | A1* | 3/2014 | Nair | H01L 23/5389 361/679.02 |
| 2014/0091440 | A1* | 4/2014 | Nair | H01L 24/24 257/659 |
| 2014/0167292 | A1* | 6/2014 | Masumura | H01L 24/48 257/784 |
| 2014/0342679 | A1* | 11/2014 | Choudhury | H01L 23/3677 455/90.2 |
| 2017/0250171 | A1* | 8/2017 | Yu | H01L 24/97 |
| 2020/0253040 | A1* | 8/2020 | Dalmia | H05K 1/028 |

* cited by examiner

MICROELECTRONIC ASSEMBLIES HAVING FRONT END UNDER EMBEDDED RADIO FREQUENCY DIE

BACKGROUND

Some integrated circuit devices may include radio frequency (RF) components, such as an RF die and front end circuitry. These components may be used for wireless communication, among other applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Microelectronic assemblies, and related devices and methods, are disclosed herein. For example, in some embodiments, a microelectronic assembly may include a package substrate having a first surface and an opposing second surface; an RF die having a surface area and a plurality of contacts on a face, where the RF die is embedded in the package substrate with the plurality of contacts facing towards the second surface of the package substrate, and an RF front end between the RF die and the first surface of the package substrate, where the RF front end is below the RF die and does not extend beyond the lateral surface area of the RF die.

Integrated circuit devices may include a radio frequency (RF) die, a front end or RF circuitry, and passive components (e.g., inductors, capacitors, and antennas) on a package substrate for the transfer of data. The size and performance of wireless electronic devices is constrained by the arrangement and placement of RF components on a package substrate, among other considerations.

Integration of high performance wireless radios, such as millimeter wave (mm-wave) radios, on integrated circuit (IC) packages is challenging due to the increasingly small size of IC packages, thermal constraints, and power delivery constraints, among others. Such radios may be used for wireless docking applications, post-silicon validation, rapid synchronization and downloading as well as wireless transmission of uncompressed high definition (HD) video. Common architectures for integrated antenna arrays include a single RF die and an RF front end side-by-side in a package substrate. This architecture may increase the X-Y (i.e., the lateral surface area which is equal to length times width) dimensions of the IC package. IC packages, also referred to herein as microelectronic packages, with an integrated RF die having reduced size may be desirable.

Various ones of the embodiments disclosed herein may help achieve better wireless transmission and reception of information by having an RF die embedded within an IC package substrate and an RF front end underneath the RF die, where the RF front end does not extend beyond the lateral surface area of the RF die (also referred to herein as the footprint of the RF die or the X-Y area of the RF die). Various ones of the microelectronic assemblies disclosed herein may exhibit reduced signal noise while reducing the size of the package relative to conventional approaches. The microelectronic assemblies disclosed herein may be particularly advantageous for small and low-profile applications in computers, tablets, industrial robots, and consumer electronics (e.g., wearable devices) that include wireless communications.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified. As used herein, the terms "face" and "surface" may be used interchangeably.

When used to describe a range of dimensions, the phrase "between X and Y" represents a range that includes X and Y. Although certain elements may be referred to in the singular herein, such elements may include multiple subelements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). As used herein, the terms "footprint," or "shadow" of the die refers to the lateral surface area (i.e., the product of the width and the length) of the die and, when the front end does not extend beyond the footprint or shadow of the die, the lateral surface area of the front end is smaller than the lateral surface area of the die.

Figure 1:
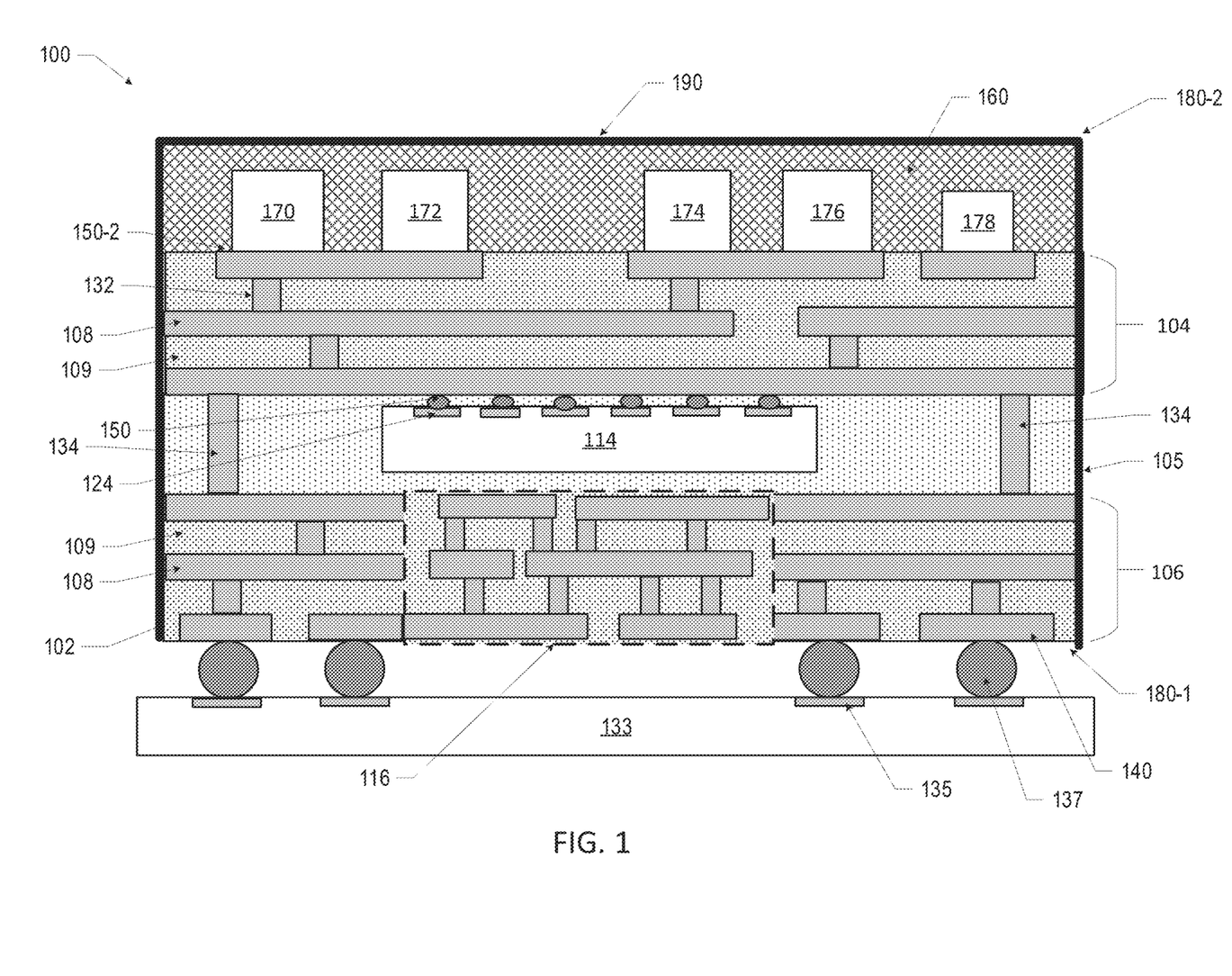
FIG. 1 is a side, cross-sectional view of an example microelectronic assembly, in accordance with various embodiments.

FIG. 1 is a side, cross-sectional view of a microelectronic assembly 100, in accordance with various embodiments. The microelectronic assembly 100 may include a package substrate 102 having a bottom surface 180-1 and an opposing top surface 180-2, an RF die 114 embedded in the package substrate 102, an RF front end 116 between the RF die 114 and the bottom surface 180-1 of the package substrate, and a plurality of surface mount devices 170, 172, 174, 176, 178 coupled to the top surface of the package substrate 180-2. The surface mount devices may include passive devices, such as capacitors, inductors, and/or a crystal. The microelectronic assembly 100 may include a package substrate 102 having an embedded RF die 114 electrically coupled to an RF front end 116 that is under the RF die 114 and does not extend beyond the surface area of the RF die. The top surface of the RF die 114 may include a set of conductive contacts 124 that may be electrically coupled to conductive pathways (e.g., conductive trace layers 108, conductive vias 132, and/or conductive through vias 134) within the package substrate via interconnects 150.

The RF die 114 may function as a single conventional RF transceiver die and may include logic circuits for converting transmitted and received signals (e.g., from analog to digital and from digital to analog), a power splitter and a power combiner, and a transmitter/receiver chain with phase shifters. In some embodiments, the RF die 114 may include a modem, logic circuits, a power splitter, a power combiner, a phase shifter, and/or an amplifier. In some embodiments, the package substrate may include an RF routing layer or region for routing RF signals between the RF die 114 and the surface mount devices 170, 172, 174, 176, 178, which may include, for example, antenna elements.

The RF front end 116 may include components such as a balun, an antenna, a duplexer, a diplexer, a multiplexer, and a filter (e.g., a bandpass filter or a low pass filter), among others. These front end components may perform important functions. For example, a balun may be used to eliminate common mode noise, a diplexer and/or a multiplexer may allow for antenna sharing, a duplexer may allow for a transmitter and a receiver to share a single antenna, and bandpass and low pass filters may reject unwanted signals and blockers. In some embodiments, the RF front end 116 may be formed by printing on a package substrate dielectric layer or layers. In some embodiments, the RF front end 116 may span two or more conductive routing layers. In some embodiments, the RF front end 116 may span three or more layers. In some embodiments, the RF front end 116 may be incorporated in the RF routing region. In some embodiments, the RF front end 116 may be integrated in the RF transmission line region underneath the RF die 114 and may not extend laterally beyond a footprint, also referred to herein as a shadow, defined by the RF die.

The RF die 114 disclosed herein may include a semiconducting material such as silicon, germanium, or III-V materials such as Gallium Arsenide or Gallium Nitride. The semiconducting materials may contain active devices such as transistors, diodes etc. The dies may also include insulating material (e.g., a dielectric material formed in multiple layers, or semiconductor material, as known in the art) and multiple conductive pathways formed through the insulating material. In some embodiments, the insulating material of an RF die 114 may include a dielectric material, such as bismaleimide triazine (BT) resin, polyimide materials, glass reinforced epoxy matrix materials, silicon dioxide or silicon nitride, or low-k and ultra low-k dielectric (e.g., carbon-doped dielectrics, fluorine-doped dielectrics, porous dielectrics, and organic polymeric dielectrics). In some embodiments, the insulating material of RF die 114 may be a semiconductor material, such as silicon, germanium, or a III-V material. In some embodiments, the RF die may include silicon. The conductive pathways in RF die 114 may include conductive traces 108 and/or conductive vias 132, 134, and may connect any of the conductive contacts in the RF die 114 and any suitable manner (e.g., connecting multiple conductive contacts on a top surface of the RF die 114). Example structures that may be included in RF die 114 disclosed herein are discussed below with reference to FIG. 6. The conductive pathways in the RF die 114 may be bordered by liner materials, such as adhesion liners and/or barrier liners, as suitable.

As shown in FIG. 1, the package substrate 102 may include conductive layers (e.g., conductive layer 108) that alternate with dielectric layers (e.g., dielectric layer 109). A conductive layer, also referred to herein as conductive trace, may include a single layer or may include multiple layers, for example, a conductive layer may include a seed layer and a patterned trace layer. In some embodiments, a conductive layer may include a conductive plane. The package substrate 102 may include an insulating material (e.g., a dielectric material formed in multiple layers, as known in the art) and one or more conductive pathways through the dielectric material (e.g., including conductive traces 108 and/or conductive vias 132, 134, as shown). A dielectric layer may include a single layer or may include multiple layers. In some embodiments, the insulating material of the package substrate 102 may be a dielectric material, such as an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In some embodiments, the conductive pathways in the package substrate 102 may be bordered by liner materials, such as adhesion liners and/or barrier liners, as suitable. In some embodiments, the package substrate 102 is coreless. In some embodiments, the package substrate 102 may include a core or carrier.

In some embodiments, an embedded RF die 114 may include conductive pathways to route power, ground, and/or signals, such as digital signals, to/from the die. In some embodiments, the dies may include conductive pathways to route power, ground, and/or signals between different ones of the components on the top and/or bottom surface (not shown) of the package substrate 102. In some embodiments, the RF die 114 may be the source and/or destination of signals communicated between the RF die and other dies (not shown) included in the microelectronic assembly. In some embodiments, the RF die 114 may couple directly to power and/or ground lines in the package substrate 102. By allowing the die to couple directly to power and/or ground lines in the package substrate 102, such power and/or ground lines need not be routed through the die, allowing the die to be made smaller or to include more active circuitry or signal pathways.

In some embodiments, the RF die 114 may include active or passive circuitry (e.g., transistors, diodes, resistors, inductors, and capacitors, among others). When the RF die includes active circuitry, power and/or ground signals may be routed through the package substrate 102 and to the die through the conductive contacts 124 on the top surface of the die. For example, RF die 114 may be coupled to a power plane or power source via conductive contacts 124, interconnects 150, and conductive pathways (e.g., conductive traces 108 and/or conductive vias 132, 134).

In some embodiments, one or more of the conductive pathways in the package substrate 102 may extend between a surface mount device 170-178 at the top surface 180-2 of the package substrate 102 and a conductive contact 124 at the top surface of the embedded RF die 114. In some embodiments, one or more of the conductive pathways in the package substrate 102 may extend between a conductive contact 124 at the top of the embedded RF die 114 and a conductive contact 140 at the bottom surface 180-1 of the package substrate 102. In some embodiments, one or more of the conductive pathways in the package substrate 102 may extend between different conductive contacts 140 at the bottom surface 180-1 of the package substrate 102 and may extend between different conductive contacts 140 via the embedded RF die 114.

Although FIG. 1 illustrates a microelectronic assembly having a package substrate with a specific number layers and arrangement of components, these are simply illustrative, and any suitable number and arrangement may be used. For example, FIG. 1 depicts the package substrate 102 having an upper portion 104 with three conductive layers, a lower portion 106 with three conductive layers, and a dielectric layer 105, with a single embedded RF die 114, between the upper portion 104 and the lower portion 106 of the package substrate. The microelectronic assemblies disclosed herein may have a package substrate with any suitable number of layers and arrangement of components, including more or less than six layers, more than one embedded die, and additional components attached to the top surface 180-2 and/or bottom surface 180-1 of the package substrate 102. For example, one or more dies may be coupled to the top surface 180-2 or bottom surface 180-1 of the package substrate via first level interconnects (not shown), and the package substrate may be coupled to a circuit board 133 via second level interconnects 137.

Although FIG. 1 depicts a single RF die 114, the microelectronic assemblies disclosed herein may have any suitable number of embedded RF dies 114 and in any suitable number of layers. In particular, the number of embedded RF dies 114 may depend on the number of antenna elements. In some embodiments, the number of RF dies equals the number of antenna elements. In some embodiments, two or more antenna elements may share one embedded RF die 114, such that the number of antenna elements is greater than the number of RF dies. In some embodiments, one antenna element may be coupled to two RF dies, such that the number of RF dies 114 is greater than the number of antenna elements; for example, where each die has a particular polarization associated with the polarized antenna.

Although FIG. 1 illustrates a specific number and arrangement of conductive pathways in the package of 102 and/or RF die 114, these are simply illustrative, and any suitable number and arrangement may be used. The conductive pathways disclosed herein (e.g., conductive traces 108 and/or conductive vias 132, 134) may be formed of any appropriate conductive material, such as copper, silver, nickel, gold, aluminum, or other metals or alloys, for example. The conductive pathways may have any suitable dimensions. For example, in some embodiments, the conductive pathways may have a thickness between 1 micron (um) and 150 um. In some embodiments, the conductive pathways may have a thickness between 2 um and 40 um. In some embodiments, the conductive pathways have a same thickness. In some embodiments, the conductive pathways have a different thickness.

The conductive interconnects 150 may take any suitable form. In some embodiments, the conductive interconnects 150 may include padless traces and/or padless vias, or any other suitable thin stand-off height techniques, such as, for example, an anisotropic conductive material (e.g., anisotropic conductive film (ACF)), die attach film (DAF), ultra-small stand-off height solder with non-conductive film (NCF), and metal-to-metal interconnects, among others. In some embodiments, the conductive interconnects 150 may include solder (e.g., solder bumps or balls that are subject to a thermal reflow to form the interconnects 150), and may include any appropriate solder material, such as lead/tin, tin/bismuth, eutectic tin/silver, ternary tin/silver/copper, eutectic tin/copper, or other alloys.

In some embodiments, the package substrate 102 may be a lower density medium and the RF die 114 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. For example, in some embodiments, a higher density medium (e.g., the RF die 114) may have a line or space pitch of approximately 10 um, while a lower density medium (e.g., the package substrate 102) may have a line or space pitch of approximately 40-50 um. In some embodiments, a higher density medium may have a line or space pitch of less than 20 um, while a lower density medium may have a line or space pitch greater than 40 um. In some embodiments, a higher density medium may have a line or space pitch less than 100 um, while a lower density medium may have a line or space pitch greater than 100 um (e.g., greater than 200 um). In some embodiments, a higher density medium may be manufactured using a modified semi-additive process or a semi-additive build up process with advanced lithography (with small vertical interconnect features formed by advanced laser or lithography processes), while a lower density medium may be a printed circuit board (PCB) manufactured using a standard PCB process (e.g., a standard subtractive process using etch chemistry to remove areas of unwanted copper, and with coarse vertical interconnect features formed by a standard laser process).

FIG. 1 depicts a plurality of surface mount devices 170-178 on the top surface 180-2 of the package substrate 102. The plurality of surface mount devices 170-178 may be electrically coupled to contacts on the top surface 180-2 of the package substrate via any suitable connection, including, for example, surface mount technology, solder bumps, pillars, or balls. The plurality of surface mount devices may include a passive component, such as a capacitor, a transistor, an inductor, or an antenna. An antenna may include a single-layer antenna, or a multi-layer antenna. The multi-layer antenna may have broader frequency bandwidth relative to a single-layer antenna. The multi-layer antenna may be a surface mount device or may be implemented on one, two, or more layers of the package substrate. For example, a multi-layer antenna may include a first layer of antenna elements and a second layer of antenna elements separated by a dielectric layer. In some embodiments, the multi-layer antenna may have the first layer of antenna elements coupled to the second layer of antenna elements via conductive pathways. In some embodiments, the multi-layer antenna may include a capacitively coupled antenna where the first layer of antenna elements is capacitively coupled to the second layer of antenna elements and not galvanically coupled via conductive pathways. When capacitively coupled, signals transmitted from the first layer of antenna elements may excite the second layer of antenna elements into transmission as well. In some embodiments, the capacitively coupled antenna elements may be vertically aligned. In some embodiments, an antenna may include a stacked patch antenna, a slot antenna, a dipole antenna, a monopole antenna, a spiral antenna, a tapered slot antenna, or any other type of antenna suitable for transmission of RF signals.

The microelectronic assembly of FIG. 1 may include a mold material 160. In some embodiments, the mold material may extend around one or more of the surface mount devices 170-178 on the top surface 180-2 of the package substrate 102. In some embodiments, the mold material 160 may extend above one or more of the surface mount devices 170-178 on the top surface 180-2 of the package substrate 102. In some embodiments, the mold material 160 extends to cover the sides of the package substrate 102 such that only the bottom surface 180-1 is not covered in mold material. The mold material 160 may have any suitable thickness and may be composed of any suitable material or combination of materials. The mold material 160 may be an insulating material, such as an appropriate epoxy material. In some embodiments, the mold material 160 may have a thickness of about 200 um to 600 um. In some embodiments, the mold material may provide mechanical support.

The microelectronic assembly of FIG. 1 may include a conformal shield 190 to reduce RF signal leakage. The conformal shield 190 may be deposited on the mold material and may extend to cover the package substrate 102 on the top surface 180-2 and on all sides such that only the bottom surface of the 180-1 of the package substrate is not shielded. The conformal shield may have any suitable thickness and may be formed of any suitable conductive material, such as copper. In some embodiments, the conformal shield may have a thickness of 1 um to 10 um. In some embodiments, the conformal shield may have a thickness of less than 5 um. In some embodiments, the conformal shield 190 may be a ground plane. In some embodiments, the conformal shield 190 may be a conductive plane.

The microelectronic assembly of FIG. 1 may also include a circuit board 133. The package substrate 102 may be coupled to the circuit board 133 by second level interconnects 137 at the bottom surface 180-1 of the package substrate 102. In particular, the package substrate 102 may include conductive contacts 140 at its bottom surface, and the circuit board 133 may include conductive contacts 135 at its top surface; the second level interconnects 137 may electrically and mechanically couple the conductive contacts 135 and the conductive contacts 140. The second level interconnects 137 illustrated in FIG. 1 are solder balls (e.g., for a ball grid array arrangement), but any suitable second level interconnects 137 may be used (e.g., pins in a pin grid array arrangement or lands in a land grid array arrangement). The circuit board 133 may be a motherboard, for example, and may have other components attached to it (not shown). The circuit board 133 may include conductive pathways and other conductive contacts (not shown) for routing power, ground, and signals through the circuit board 133, as known in the art. In some embodiments, the circuit board 133 may include an antenna (not shown) and the RF die 114 may be electrically coupled to the antenna via the RF conductive pathways, which includes the RF front end 116. In some embodiments, the second level interconnects 137 may not couple the package substrate 102 to a circuit board 133, but may instead couple the package substrate 102 to another IC package, an interposer, or any other suitable component.

The elements of the microelectronic assembly 100 may have any suitable dimensions. For example, in some embodiments, a thickness of the package substrate 102 may be between 0.2 millimeters and 0.5 millimeters (e.g., between 0.25 millimeters and 0.35 millimeters, or approximately 0.3 millimeters).

A number of elements are not illustrated in FIG. 1, but may be present in microelectronic assemblies disclosed herein, for example, additional active components, such as dies, or additional passive components may be disposed on the top surface or the bottom surface of the package substrate 102, or embedded in the package substrate 102, and may be electrically connected to an embedded RF die 114.

Figure 2:
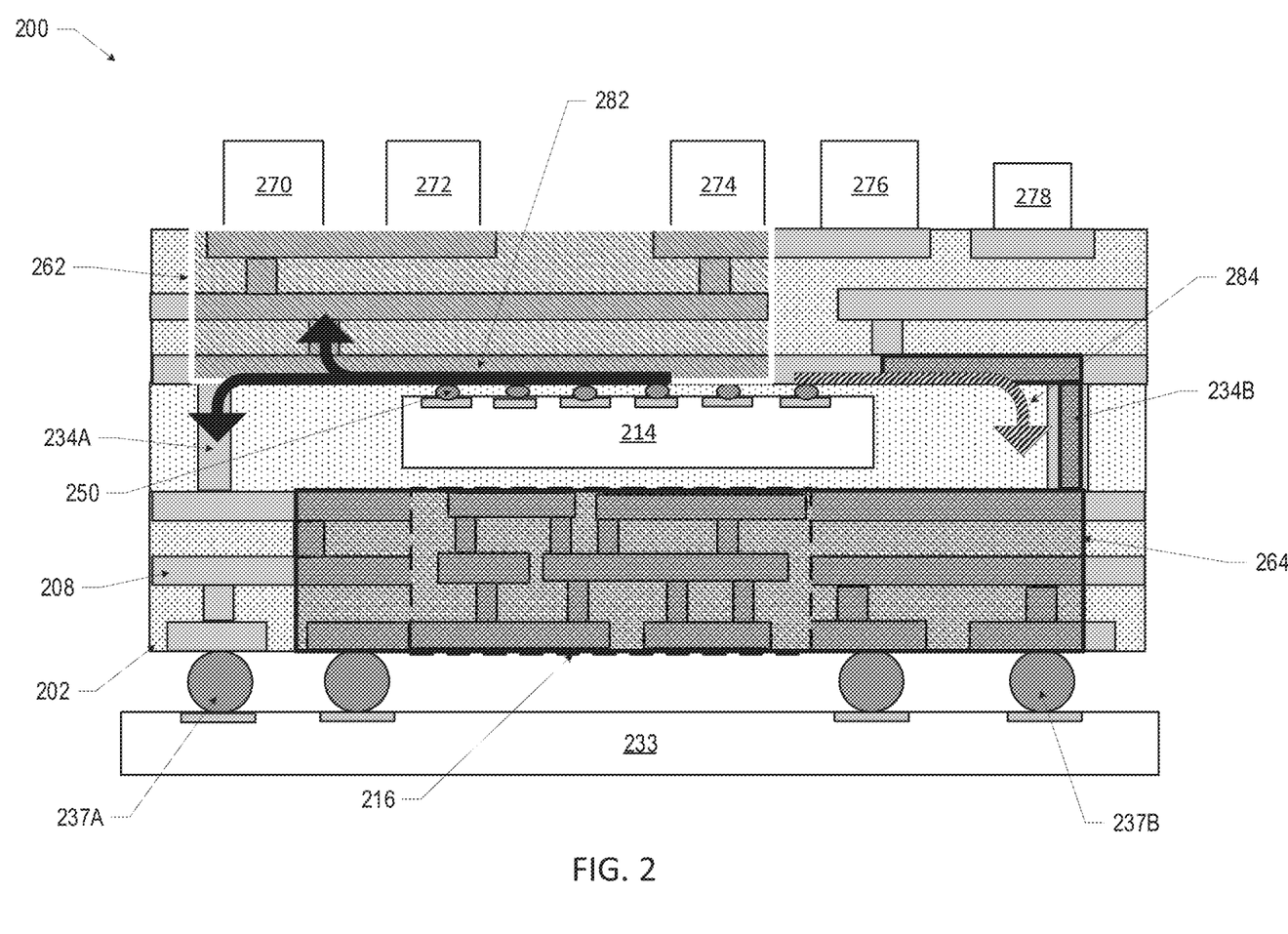
FIG. 2 is a side, cross-sectional view of an example microelectronic assembly, in accordance with various embodiments.

FIG. 2 is a side, cross-sectional view of an example microelectronic assembly 200 having designated signal layers, in accordance with various embodiments. In the microelectronic assembly of FIG. 2, the package substrate 202 may include one or more designated conductive layers 262 for routing power, ground, and/or digital signals 282, also referred to herein as the signal trace layer or signal lines, from the RF die 214 to one or more surface mounted devices 270-278, and/or to the circuit board 233. The package substrate 202 may include one or more designated conductive layers for routing RF transmission lines 284, also referred to herein as the RF routing region, from the RF die to the RF front end 216 and the circuit board 233. For example, as shown in FIG. 2, the RF transmission lines 284 may be routed from a first edge of the RF die to conductive layers below the RF die via conductive pathways (e.g., interconnect 250, via 234B, RF routing region 264, RF front end 216, and interconnect 237B) while the power/ground/digital signals may be routed from a second edge of the RF die to conductive layers above the RF die via conductive pathways (e.g., interconnect 250 and conductive trace layers 262), or to the circuit board 233 below the RF die via conductive pathways (e.g., interconnect 250, via 234A, conductive traces 208, and interconnect 237A) as well as to components on the circuit board 133, such as an antenna (not shown). The separate conductive pathways may help to isolate the RF signals from the power, ground, and/or digital signals, and reduce signal interference and/or noise. In some embodiments, the RF front end 216 may be part of the RF routing region 264, which may include one or more layers. In some embodiments, the RF transmission lines may connect to the RF front end at one or more connection points for transmitting and receiving signals. The RF routing region 264 may be formed using any suitable process and may be made of any suitable conductive material, such as copper, silver, nickel, gold, aluminum, or other metals or alloys. In some embodiments, the RF routing region 264 and the signal trace layer 262 are formed from the same material.

Figure 3:
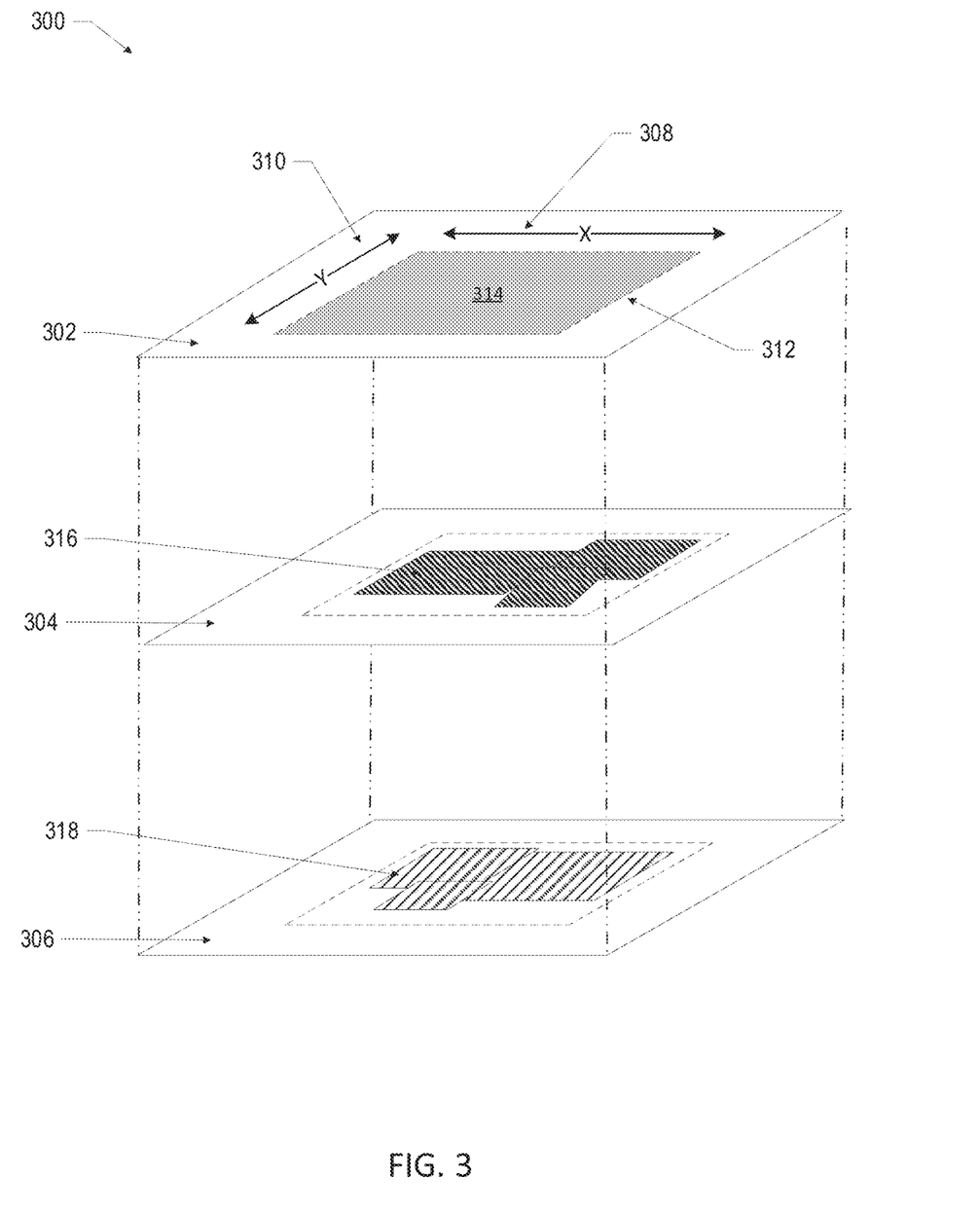
FIG. 3 is an expanded view of an RF front end in an example microelectronic assembly, in accordance with various embodiments.

FIG. 3 is an expanded view of an example RF front end in a microelectronic assembly 300, in accordance with various embodiments. FIG. 3 depicts an expanded view of three layers of a package substrate. Package substrate layer 302 includes an embedded RF die 314 having a footprint 312, or lateral surface area, defined by the lateral dimensions X-Y 308, 310 and illustrated by the dotted line along the perimeter of the RF die 314. Package substrate layer 304 includes a first layer 316 of an RF front end positioned below the RF die 314 and within the footprint 312 of the RF die 314. Although FIG. 3 shows the first layer of the RF front end directly beneath the RF die layer, one or more layers may be included between these layers. Package substrate layer 306 includes a second layer 318 of an RF front end positioned below the first layer 316 of the RF front end and within the footprint 312 of the RF die 314. Although FIG. 3 shows an RF front end having two conductive layers, an RF front end may include any suitable number of conductive layers and may have any lateral dimensions that are equal to or smaller than the lateral dimensions of the associated RF die.

Figure 4:
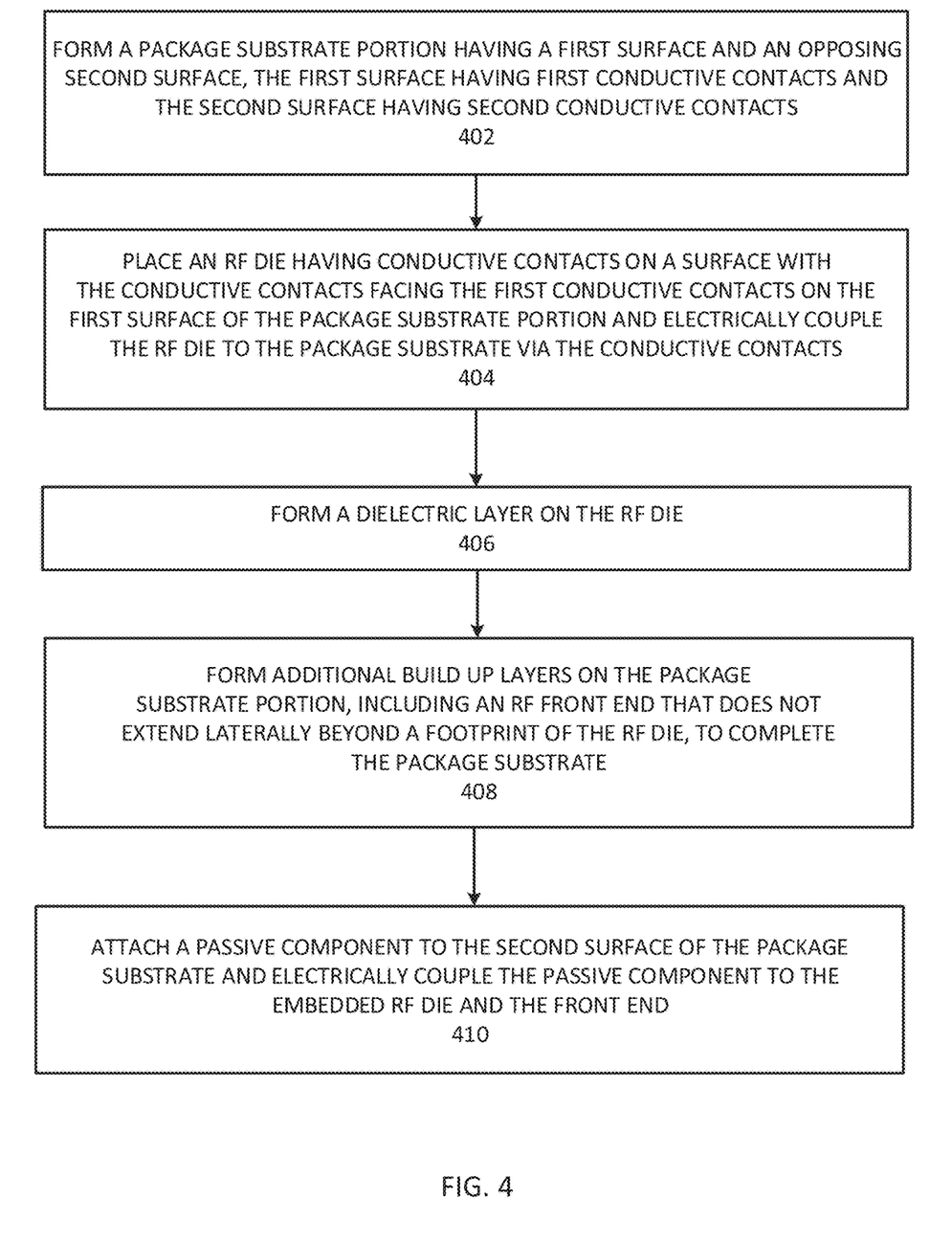
FIG. 4 is a process flow diagram of an example method of forming a microelectronic assembly, in accordance with various embodiments.

FIG. 4 is a process flow diagram of an example method of forming a microelectronic assembly, in accordance with various embodiments. Any suitable techniques may be used to manufacture the microelectronic assemblies disclosed herein. For example, FIG. 4 describes an example process for manufacturing a microelectronic assembly, in accordance with various embodiments. Although the operations discussed with FIG. 4 are illustrated in a particular order, these operations may be performed in any suitable order. Additionally, although particular assemblies are illustrated in the accompanying figures, the operations discussed below with reference to FIG. 4 may be used to form any suitable assemblies. At 402, a package substrate portion may be formed having a first surface and an opposing second surface, where the first surface has first conductive contacts and the second surface has second conductive contacts. In some embodiments, the package substrate portion may be formed using a lithographically defined via packaging process. In some embodiments, the package substrate portion may be manufactured using standard PCB manufacturing processes. In some embodiments, the package substrate portion may be a set of redistribution layers formed on a panel carrier by laminating or spinning on a dielectric material, and creating conductive vias and lines by laser drilling and plating. In some embodiments, the package substrate portion may be formed on a removable carrier using any suitable technique, such as a redistribution layer technique. Any method known in the art for fabrication of the package substrate portion may be used, and for the sake of brevity, such methods will not be discussed in further detail herein. The package substrate portion may be built up to a desired layer for embedding the die. The first and second conductive contacts on the package substrate portion may be any suitable contact, such as contact pads.

At 404, an RF die having conductive contacts on a surface may be placed on the first surface of the package substrate portion, such that the conductive contacts on the surface of the RF die face the first conductive contacts on the package substrate portion, and electrically couple the RF die to the package substrate portion via the conductive contacts. The RF die may be coupled to a carrier and placed on the first surface of the package substrate with the carrier. The carrier may be removed after the RF die has been placed and the conductive contacts on the RF die have been aligned with the first conductive contacts on the package substrate portion. The conductive contacts may be coupled using any suitable connection as described above with reference to FIG. 1. In this example, the RF die is attached in inverted or "upside down" on the package substrate portion, in the sense that once assembled, the package substrate will be flipped over or inverted with the second surface as the top surface of the package substrate.

At 406, form a dielectric layer on the RF die. The dielectric layer may be formed using any suitable process, including lamination, and may be reduced to the desired thickness, if necessary, using any suitable technique, including, for example, grinding, etching, such as reactive ion etching (RIE) or chemical etching.

At 408, form additional build up layers on the package substrate portion to complete the package substrate, including forming an RF front end that does not extend laterally beyond the footprint of the RF die. In some embodiments, the RF front end spans two or more conductive routing layers. In some embodiments, an RF routing region may be formed and the RF front end may be part of the RF routing region. Additional dielectric and conductive layers (e.g., build up layers) may be formed on the package substrate portion using any suitable process as described above at 402 to complete the package substrate.

At 410, attach one or more passive components to the second surface of the package substrate and electrically couple the one or more passive components to the RF die and the RF front end via conductive pathways in the package substrate. Optionally, provide a mold material around and/or over the one or more passive components on the second surface of the package substrate. In some embodiments, the mold material may be deposited along the sides of the package substrate. In some embodiments, a conformal shield may be provided over the mold material. Further processes may be performed, including forming second level interconnects on the first surface of the package substrate and electrically coupling the package substrate to a circuit board via the second level interconnects.

The microelectronic assemblies disclosed herein may provide one or more of the following advantages. First, the new architecture of an embedded RF die with an RF front end under the RF die and within the footprint of the RF die enables the package substrate to have smaller lateral dimensions (X-Y directions). Second, by isolating the RF signals from the ground, power and/or digital signals, signal interference may be reduced and RF performance may be improved. Third, an RF front end may be custom tailored for a package substrate having an embedded RF die without increasing the overall surface area of the package substrate.

The microelectronic assemblies disclosed herein may be included in any suitable electronic component. FIGS. 5-11 illustrate various examples of apparatuses that may include, or be included in, any of the microelectronic assemblies disclosed herein.

Figure 5:
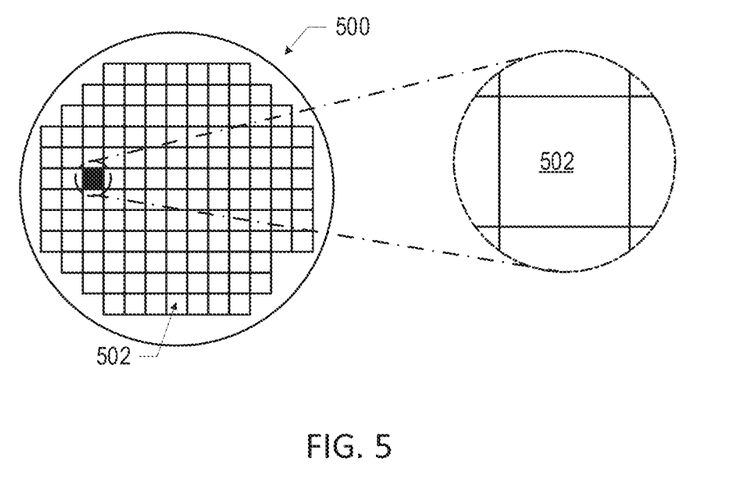
FIG. 5 is a top view of a wafer and dies that may be included in a microelectronic assembly, in accordance with any of the embodiments disclosed herein.

FIG. 5 is a top view of a wafer 500 and dies 502 that may be included in any of the microelectronic assemblies disclosed herein (e.g., any of the RF dies 114 disclosed herein). The wafer 500 may be composed of semiconductor material and may include one or more dies 502 having IC structures formed on a surface of the wafer 500. Each of the dies 502 may be a repeating unit of a semiconductor product that includes any suitable IC. After the fabrication of the semiconductor product is complete, the wafer 500 may undergo a singulation process in which the dies 502 are separated from one another to provide discrete "chips" of the semiconductor product. The die 502 may be any of the RF dies 114 disclosed herein. The die 502 may include one or more transistors (e.g., some of the transistors 640 of FIG. 6, discussed below), supporting circuitry to route electrical signals to the transistors, passive components (e.g., signal traces, resistors, capacitors, or inductors), and/or any other IC components. In some embodiments, the wafer 500 or the die 502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device (e.g., the processing device 802 of FIG. 8) or other logic that is configured to store information in the memory devices or execute instructions stored in the memory array. Various ones of the microelectronic assemblies disclosed herein may be manufactured using a die-to-wafer assembly technique in which some dies are attached to a wafer 500 that include others of the dies, and the wafer 500 is subsequently singulated.

Figure 6:
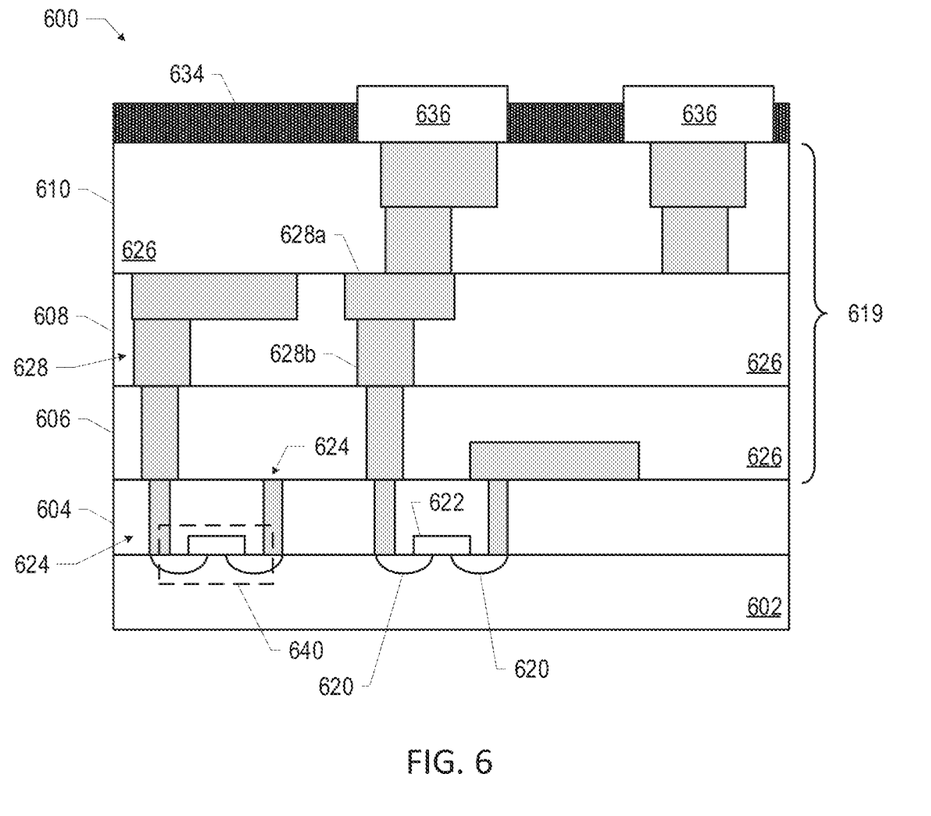
FIG. 6 is a cross-sectional side view of an integrated circuit device that may be included in a microelectronic assembly, in accordance with any of the embodiments disclosed herein.

FIG. 6 is a cross-sectional side view of an example IC device 600 that may be included in any of the microelectronic assemblies disclosed herein (e.g., in any of the RF dies 114). One or more of the IC devices 600 may be included in one or more dies 502 (FIG. 5). The IC device 600 may be formed on a substrate 602 (e.g., the wafer 500 of FIG. 5) and may be included in a die (e.g., the die 502 of FIG. 5). The substrate 602 may be a semiconductor substrate composed of semiconductor material systems including, for example, n-type or p-type materials systems (or a combination of both). The substrate 602 may include, for example, a crystalline substrate formed using a bulk silicon or a silicon-on-insulator (SOI) substructure. In some embodiments, the substrate 602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 602. Although a few examples of materials from which the substrate 602 may be formed are described here, any material that may serve as a foundation for an IC device 600 may be used. The substrate 602 may be part of a singulated die (e.g., the dies 502 of FIG. 5) or a wafer (e.g., the wafer 500 of FIG. 5).

The IC device 600 may include one or more device layers 604 disposed on the substrate 602. The device layer 604 may include features of one or more transistors 640 (e.g., metal oxide semiconductor field-effect transistors (MOSFETs)) formed on the substrate 602 and/or any other active and/or passive circuitry as may be desired by a device manufacturer. The device layer 604 may include, for example, one or more source and/or drain (S/D) regions 620, a gate 622 to control current flow in the transistors 640 between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 640 may include a gate 622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 620 may be formed within the substrate 602 adjacent to the gate 622 of each transistor 640. The S/D regions 620 may be formed using an implantation/diffusion process or an etching/deposition process, for example. In the former process, dopants such as boron, aluminum, antimony, phosphorous, or arsenic may be ion-implanted into the substrate 602 to form the S/D regions 620. An annealing process that activates the dopants and causes them to diffuse farther into the substrate 602 may follow the ion-implantation process. In the latter process, the substrate 602 may first be etched to form recesses at the locations of the S/D regions 620. An epitaxial deposition process may then be carried out to fill the recesses with material that is used to fabricate the S/D regions 620. In some implementations, the S/D regions 620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 620 may be formed using one or more alternate semiconductor materials such as germanium or a group III-V material or alloy. In further embodiments, one or more layers of metal and/or metal alloys may be used to form the S/D regions 620.

Electrical signals, such as power and/or input/output (I/O) signals, may be routed to and/or from the devices (e.g., transistors 640) of the device layer 604 through one or more interconnect layers disposed on the device layer 604 (illustrated in FIG. 6 as interconnect layers 606, 608, and 610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form a metallization stack (also referred to as an "ILD stack") 619 of the IC device 600.

The interconnect structures 628 may be arranged within the interconnect layers 606-610 to route electrical signals according to a wide variety of designs. In particular, the arrangement is not limited to the particular configuration of interconnect structures 628 depicted in FIG. 6. For example, the interconnect structures may be arranged as multidirectional interconnect structures. Although a particular number of interconnect layers 606-610 is depicted in FIG. 6, some embodiments of the present disclosure include IC devices having more or fewer interconnect layers than depicted.

In some embodiments, the interconnect structures 628 may include lines 628a and/or vias 628b filled with an electrically conductive material such as a metal. The lines 628a may be arranged to route electrical signals in a direction of a plane that is substantially parallel with a surface of the substrate 602 upon which the device layer 604 is formed. For example, the lines 628a may route electrical signals in a direction in and out of the page from the perspective of FIG. 6. The vias 628b may be arranged to route electrical signals in a direction of a plane that is substantially perpendicular to the surface of the substrate 602 upon which the device layer 604 is formed. In some embodiments, the vias 628b may electrically couple lines 628a of different interconnect layers 606-610 together.

The interconnect layers 606-610 may include a dielectric material 626 disposed between the interconnect structures 628, as shown in FIG. 6. In some embodiments, the dielectric material 626 disposed between the interconnect structures 628 in different ones of the interconnect layers 606-610 may have different compositions; in other embodiments, the composition of the dielectric material 626 between different interconnect layers 606-610 may be the same.

A first interconnect layer 606 (referred to as Metal 1 or "M1") may be formed directly on the device layer 604. In some embodiments, the first interconnect layer 606 may include lines 628a and/or vias 628b, as shown. The lines 628a of the first interconnect layer 606 may be coupled with contacts (e.g., the S/D contacts 624) of the device layer 604.

A second interconnect layer 608 (referred to as Metal 2 or "M2") may be formed directly on the first interconnect layer 606. In some embodiments, the second interconnect layer 608 may include vias 628b to couple the lines 628a of the second interconnect layer 608 with the lines 628a of the first interconnect layer 606. Although the lines 628a and the vias 628b are structurally delineated with a line within each interconnect layer (e.g., within the second interconnect layer 608) for the sake of clarity, the lines 628a and the vias 628b may be structurally and/or materially contiguous (e.g., simultaneously filled during a dual-damascene process) in some embodiments.

A third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606. In some embodiments, the interconnect layers that are "higher up" in the metallization stack 619 in the IC device 600 (i.e., farther away from the device layer 604) may be thicker.

The IC device 600 may include a solder resist material 634 (e.g., polyimide or similar material) and one or more conductive contacts 636 formed on the interconnect layers 606-610. In FIG. 6, the conductive contacts 636 are illustrated as taking the form of bond pads. The conductive contacts 636 may be electrically coupled with the interconnect structures 628 and configured to route the electrical signals of the transistor(s) 640 to other external devices. For example, solder bonds may be formed on the one or more conductive contacts 636 to mechanically and/or electrically couple a chip including the IC device 600 with another component (e.g., a circuit board). The IC device 600 may include additional or alternate structures to route the electrical signals from the interconnect layers 606-610; for example, the conductive contacts 636 may include other analogous features (e.g., posts) that route the electrical signals to external components. The conductive contacts 636 may serve as the conductive contacts 124, as appropriate.

Figure 7:
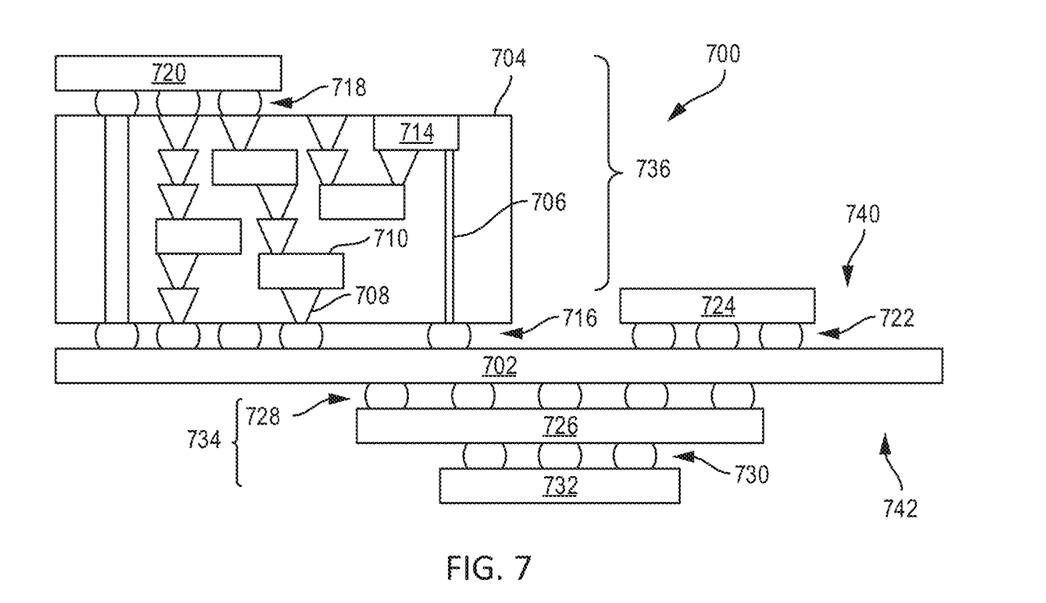
FIG. 7 is a cross-sectional side view of an integrated circuit device assembly that may include a microelectronic assembly, in accordance with any of the embodiments disclosed herein.

FIG. 7 is a cross-sectional side view of an IC device assembly 700 that may include any of the microelectronic assemblies disclosed herein. In some embodiments, the IC device assembly 700 may be a microelectronic assembly. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702; generally, components may be disposed on one or both faces 740 and 742. Any of the IC packages discussed below with reference to the IC device assembly 700 may take the form of any suitable ones of the embodiments of the microelectronic assemblies disclosed herein.

In some embodiments, the circuit board 702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704; indeed, additional interposers may be coupled to the interposer 704. The interposer 704 may provide an intervening substrate used to bridge the circuit board 702 and the IC package 720. The IC package 720 may be or include, for example, a die (the die 502 of FIG. 5), an IC device (e.g., the IC device 600 of FIG. 6), or any other suitable component. Generally, the interposer 704 may spread a connection to a wider pitch or reroute a connection to a different connection. For example, the interposer 704 may couple the IC package 720 (e.g., a die) to a set of ball grid array (BGA) conductive contacts of the coupling components 716 for coupling to the circuit board 702. In the embodiment illustrated in FIG. 7, the IC package 720 and the circuit board 702 are attached to opposing sides of the interposer 704; in other embodiments, the IC package 720 and the circuit board 702 may be attached to a same side of the interposer 704. In some embodiments, three or more components may be interconnected by way of the interposer 704.

In some embodiments, the interposer 704 may be formed as a PCB, including multiple metal layers separated from one another by layers of dielectric material and interconnected by electrically conductive vias. In some embodiments, the interposer 704 may be formed of an epoxy resin, a fiberglass-reinforced epoxy resin, an epoxy resin with inorganic fillers, a ceramic material, or a polymer material such as polyimide. In some embodiments, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to TSVs 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Figure 8:
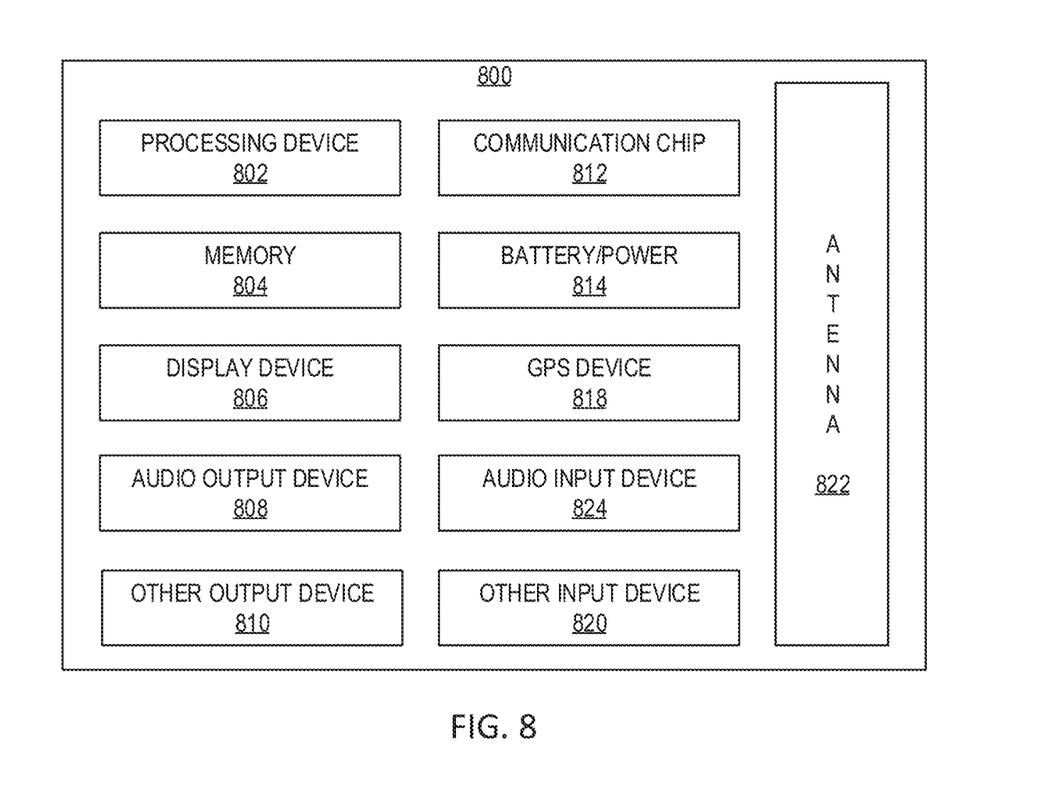
FIG. 8 is a block diagram of an example electrical device that may include a microelectronic assembly, in accordance with any of the embodiments disclosed herein.

FIG. 8 is a block diagram of an example electrical device 800 that may include one or more of the microelectronic assemblies disclosed herein. For example, any suitable ones of the components of the electrical device 800 may include one or more of the IC device assemblies 700, IC devices 600, or dies 502 disclosed herein, and may be arranged in any of the microelectronic assemblies disclosed herein. A number of components are illustrated in FIG. 8 as included in the electrical device 800, but any one or more of these components may be omitted or duplicated, as suitable for the application. In some embodiments, some or all of the components included in the electrical device 800 may be attached to one or more motherboards. In some embodiments, some or all of these components are fabricated onto a single system-on-a-chip (SoC) die.

Additionally, in various embodiments, the electrical device 800 may not include one or more of the components illustrated in FIG. 8, but the electrical device 800 may include interface circuitry for coupling to the one or more components. For example, the electrical device 800 may not include a display device 806, but may include display device interface circuitry (e.g., a connector and driver circuitry) to which a display device 806 may be coupled. In another set of examples, the electrical device 800 may not include an audio input device 824 or an audio output device 808, but may include audio input or output device interface circuitry (e.g., connectors and supporting circuitry) to which an audio input device 824 or audio output device 808 may be coupled.

The electrical device 800 may include a processing device 802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 800 may include a memory 804, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the memory 804 may include memory that shares a die with the processing device 802. This memory may be used as cache memory and may include embedded dynamic random access memory (eDRAM) or spin transfer torque magnetic random access memory (STT-M RAM).

In some embodiments, the electrical device 800 may include a communication chip 812 (e.g., one or more communication chips). For example, the communication chip 812 may be configured for managing wireless communications for the transfer of data to and from the electrical device 800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 812 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 812 may operate in accordance with other wireless protocols in other embodiments. The electrical device 800 may include an antenna 822 to facilitate wireless communications and/or to receive other wireless communications (such as AM or FM radio transmissions).

In some embodiments, the communication chip 812 may manage wired communications, such as electrical, optical, or any other suitable communication protocols (e.g., the Ethernet). As noted above, the communication chip 812 may include multiple communication chips. For instance, a first communication chip 812 may be dedicated to shorter-range wireless communications such as Wi-Fi or Bluetooth, and a second communication chip 812 may be dedicated to longer-range wireless communications such as global positioning system (GPS), EDGE, GPRS, CDMA, WiMAX, LTE, EV-DO, or others. In some embodiments, a first communication chip 812 may be dedicated to wireless communications, and a second communication chip 812 may be dedicated to wired communications.

The electrical device 800 may include battery/power circuitry 814. The battery/power circuitry 814 may include one or more energy storage devices (e.g., batteries or capacitors) and/or circuitry for coupling components of the electrical device 800 to an energy source separate from the electrical device 800 (e.g., AC line power).

The electrical device 800 may include a display device 806 (or corresponding interface circuitry, as discussed above). The display device 806 may include any visual indicators, such as a heads-up display, a computer monitor, a projector, a touchscreen display, a liquid crystal display (LCD), a light-emitting diode display, or a flat panel display.

The electrical device 800 may include an audio output device 808 (or corresponding interface circuitry, as discussed above). The audio output device 808 may include any device that generates an audible indicator, such as speakers, headsets, or earbuds.

The electrical device 800 may include an audio input device 824 (or corresponding interface circuitry, as discussed above). The audio input device 824 may include any device that generates a signal representative of a sound, such as microphones, microphone arrays, or digital instruments (e.g., instruments having a musical instrument digital interface (MIDI) output).

The electrical device 800 may include a GPS device 818 (or corresponding interface circuitry, as discussed above). The GPS device 818 may be in communication with a satellite-based system and may receive a location of the electrical device 800, as known in the art.

The electrical device 800 may include another output device 810 (or corresponding interface circuitry, as discussed above). Examples of the other output device 810 may include an audio codec, a video codec, a printer, a wired or wireless transmitter for providing information to other devices, or an additional storage device.

The electrical device 800 may include another input device 820 (or corresponding interface circuitry, as discussed above). Examples of the other input device 820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 800 may have any desired form factor, such as a hand-held/portable or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server device or other networked computing component, a printer, a scanner, a monitor, a set-top box, an entertainment control unit, a vehicle control unit, a digital camera, a digital video recorder, a wearable electrical device, or a wearable computing device. In some embodiments, the electrical device 800 may be any other electronic device that processes data.

The following paragraphs provide various examples of the embodiments disclosed herein.

Example 1 is a microelectronic assembly including: a package substrate having a first face and an opposing second face; a radio frequency (RF) die having a plurality of contacts on a first face, wherein the RF die is embedded in the package substrate with the first face of the RF die facing towards the first face of the package substrate; and an RF front end between the RF die and the second face of the package substrate, wherein the RF front end does not extend laterally beyond a footprint of the RF die.

Example 2 may include the subject matter of Example 1, and may further specify that the RF front end spans two or more conductive routing layers.

Example 3 may include the subject matter of Example 1, and may further specify that the RF front end comprises a balun.

Example 4 may include the subject matter of Example 1, and may further specify that the RF front end comprises a duplexer.

Example 5 may include the subject matter of Example 1, and may further specify that the RF front end comprises a low pass filter or a bandpass filter.

Example 6 may include the subject matter of Example 1, and may further include an RF routing region between the RF die and the second face of the package substrate, wherein the RF front end is part of the RF routing region.

Example 7 may include the subject matter of Example 1, and may further include a ground/power routing layer between the RF die and the first face of the package substrate.

Example 8 may include the subject matter of Example 1, and may further include a surface mount device coupled to the first face of the package substrate.

Example 9 may include the subject matter of Example 8, and may further specify that the surface mount device includes a capacitor, an inductor, or a crystal.

Example 10 may include the subject matter of Example 8, and may further include a mold material on the surface mount device.

Example 11 may include the subject matter of Example 10, and may further include a conformal shield.

Example 12 may include the subject matter of Example 1, and may further include a circuit board electrically coupled to the second face of the package substrate, wherein the circuit board includes an antenna and the RF die is electrically coupled to the antenna.

Example 13 may include the subject matter of Example 1, and may further specify that the microelectronic assembly is included in a server device.

Example 14 may include the subject matter of Example 1, and may further specify that the microelectronic assembly is included in a portable computing device.

Example 15 may include the subject matter of Example 1, and may further specify that the microelectronic assembly included in a wearable computing device.

Example 16 is an electronic device including: a package substrate having a first face and an opposing second face; a radio frequency (RF) die having a plurality of contacts on a first face, wherein the RF die is embedded in the package substrate with the first face of the RF die facing towards the first face of the package substrate; an RF front end between the RF die and the second face of the package substrate, wherein the RF front end does not extend laterally beyond a footprint of the RF die; and a circuit board electrically coupled to the second face of the package substrate.

Example 17 may include the subject matter of Example 16, and may further specify that the RF front end spans two or more conductive routing layers.

Example 18 may include the subject matter of Example 16, and may further specify that the RF front end comprises a balun.

Example 19 may include the subject matter of Example 16, and may further specify that the RF front end comprises a duplexer.

Example 20 may include the subject matter of Example 16, and may further specify that the RF front end comprises a low pass filter or a bandpass filter.

Example 21 may include the subject matter of Example 16, and may further include an RF routing region between the RF die and the second face of the package substrate, wherein the RF front end is part of the RF routing region.

Example 22 may include the subject matter of Example 16, and may further include a ground/power routing layer between the RF die and the first face of the package substrate.

Example 23 may include the subject matter of Example 16, and may further include a surface mount device coupled to the first face of the package substrate.

Example 24 may include the subject matter of Example 23, and may further specify that the surface mount device includes a capacitor, an inductor, or a crystal.

Example 25 may include the subject matter of Example 23, and may further include a mold material on the surface mount device.

Example 26 may include the subject matter of Example 25, and may further include a conformal shield.

Example 27 may include the subject matter of Example 16, and may further specify that the circuit board includes an antenna and the RF die is electrically coupled to the antenna.

Example 28 may include the subject matter of Example 16, and may further specify that the circuit board includes a display.

Example 29 may include the subject matter of Example 16, and may further specify that the electronic device is a server device.

Example 30 may include the subject matter of Example 16, and may further specify that the electronic device is a portable computing device.

Example 31 may include the subject matter of Example 16, and may further specify that the electronic device is a wearable computing device.

Example 32 is a method of manufacturing a microelectronic assembly including: forming a package substrate portion, wherein the package substrate portion has a first surface with first conductive contacts and an opposing second surface having second conductive contacts; placing an RF die having a surface with a plurality of conductive contacts on the first surface of the package substrate portion, wherein the plurality of conductive contacts on the RF die face the first surface of the package substrate portion; forming interconnects between the plurality of conductive contacts on the surface of the RF die and the first conductive contacts of the package substrate portion; forming a dielectric layer on the RF die; and forming an RF front end on the dielectric layer, wherein the RF front end does not extend laterally beyond a footprint of the RF die.

Example 33 may include the subject matter of Example 32, and may further include: forming an RF routing region on the dielectric layer, wherein the RF front end is part of the RF routing region.

Example 34 may include the subject matter of Example 32, and may further include: forming additional dielectric and conductive layers on the package substrate portion to form a package substrate; and coupling a surface mount device to the second conductive contacts on the second surface of the package substrate.

Example 35 may include the subject matter of Example 34, and may further include: providing a mold material around the surface mount device.

Example 36 may include the subject matter of Example 35, and may further include: forming a conformal shield on the mold material.

The invention claimed is:

1. A microelectronic assembly, comprising:
   a package substrate having a first face and an opposing second face, wherein the package substrate is oriented with the first face at a bottom of the package substrate and the second face at the top of the package substrate;
   a radio frequency (RF) die having a plurality of contacts on a face, wherein the RF die is embedded in the package substrate with the face of the RF die facing towards the second face of the package substrate; and
   an RF front end between the RF die and the first face of the package substrate, wherein the RF front end includes conductive traces and conductive vias and is incorporated as part of conductive routing layers of the package substrate, and wherein the RF front end does not extend laterally beyond a footprint of the RF die.

2. The microelectronic assembly of claim 1, wherein the RF front end spans two or more conductive routing layers.

3. The microelectronic assembly of claim 1, wherein the RF front end comprises a balun.

4. The microelectronic assembly of claim 1, wherein the RF front end comprises a duplexer.

5. The microelectronic assembly of claim 1, wherein the RF front end comprises a low pass filter or a bandpass filter.

6. The microelectronic assembly of claim 1, further comprising an RF routing region between the RF die and the first face of the package substrate, wherein the RF front end is part of the RF routing region.

7. The microelectronic assembly of claim 1, further comprising a ground/power routing layer between the RF die and the second face of the package substrate.

8. The microelectronic assembly of claim 1, further comprising a surface mount device coupled to the second face of the package substrate.

9. The microelectronic assembly of claim 8, wherein the surface mount device includes a capacitor, an inductor, or a crystal.

10. The microelectronic assembly of claim 8, further comprising a mold material on the surface mount device.

11. The microelectronic assembly of claim 10, further comprising a conformal shield.

12. The microelectronic assembly of claim 1, further comprising a circuit board electrically coupled to the first face of the package substrate, wherein the circuit board includes an antenna and the RF die is electrically coupled to the antenna.

13. The microelectronic assembly of claim 1, wherein the microelectronic assembly is included in a server device.

14. The microelectronic assembly of claim 1, wherein the microelectronic assembly is included in a portable computing device.

15. The microelectronic assembly of claim 1, wherein the microelectronic assembly included in a wearable computing device.

16. An electronic device, comprising:
   a package substrate having a first face and an opposing second face, wherein the package substrate is oriented with the first face at a bottom of the package substrate and the second face at the top of the package substrate;
   a radio frequency (RF) die having a plurality of contacts on a face, wherein the RF die is embedded in the package substrate with the face of the RF die facing towards the second face of the package substrate;
   an RF front end between the RF die and the first face of the package substrate, wherein the RF front end includes conductive traces and conductive vias and is incorporated as part of conductive routing layers of the package substrate, and wherein the RF front end does not extend laterally beyond a footprint of the RF die; and
   a circuit board electrically coupled to the first face of the package substrate.

17. The electronic device of claim 16, wherein the RF front end spans two or more conductive routing layers.

18. The electronic device of claim 16, wherein the RF front end comprises a balun.

19. The electronic device of claim 16, wherein the RF front end comprises a duplexer.

20. The electronic device of claim 16, wherein the RF front end comprises a low pass filter or a bandpass filter.

21. The electronic device of claim 16, further comprising an RF routing region between the RF die and the first face of the package substrate, wherein the RF front end is part of the RF routing region.

22. The electronic device of claim 16, further comprising a ground/power routing layer between the RF die and the second face of the package substrate.

23. The electronic device of claim 16, further comprising a surface mount device coupled to the second face of the package substrate.

* * * * *

UNITED STATES PATENT AND TRADEMARK OFFICE
CERTIFICATE OF CORRECTION

PATENT NO. : 11,424,195 B2
APPLICATION NO. : 15/942824
DATED : August 23, 2022
INVENTOR(S) : Eliav Shaul et al.

It is certified that error appears in the above-identified patent and that said Letters Patent is hereby corrected as shown below:

In the Claims

In Column 22, Claim 15, Line 7, delete "assembly" and insert -- assembly is --, therefor.

Signed and Sealed this
Twenty-seventh Day of December, 2022

Katherine Kelly Vidal
Director of the United States Patent and Trademark Office